(12) United States Patent
Chang et al.

(10) Patent No.: US 8,530,932 B2
(45) Date of Patent: Sep. 10, 2013

(54) REPLACEMENT SPACER FOR TUNNEL FETS

(75) Inventors: Josephine B. Chang, Mahopac, NY (US); Michael A. Guillorn, Yorktown Heights, NY (US); Isaac Lauer, White Plains, NY (US); Amlan Majumdar, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/425,654

(22) Filed: Mar. 21, 2012

(65) Prior Publication Data

US 2012/0175678 A1     Jul. 12, 2012

Related U.S. Application Data

(62) Division of application No. 12/567,963, filed on Sep. 28, 2009, now Pat. No. 8,178,400.

(51) Int. Cl.
*H01L 31/109* (2006.01)
*H01L 31/0328* (2006.01)

(52) U.S. Cl.
USPC .... 257/183; 257/104; 257/213; 257/E21.027; 257/E21.042; 257/E21.051; 257/E21.058; 257/E21.085; 257/E21.17; 257/E21.115; 257/E21.134; 257/E21.231; 257/E21.267; 257/E21.278; 257/E21.293; 257/E21.304

(58) Field of Classification Search
USPC ................. 257/183, 104, 213, 192, 197, 288, 257/E21.027, E21.042, E21.051, E21.17, 257/E21.115, E21.134, E21.231, E21.267, 257/E21.278, E21.293, E21.304
See application file for complete search history.

(56) References Cited

U.S. PATENT DOCUMENTS

| 4,675,711 A | 6/1987 | Harder et al. |
| 4,870,469 A | 9/1989 | Nishizawa et al. |
| 5,473,176 A | 12/1995 | Kakumoto |
| 5,698,869 A | 12/1997 | Yoshimi et al. |
| 5,834,793 A | 11/1998 | Shibata |
| 6,198,113 B1 | 3/2001 | Grupp |
| 6,617,643 B1 | 9/2003 | Goodwin-Johansson |

(Continued)

FOREIGN PATENT DOCUMENTS

| JP | 5190847 A | 7/1993 |
| WO | 2008/146157 A2 | 12/2008 |

OTHER PUBLICATIONS

Woo Young et al., "Tunneling Field-Effect Transistors (TFETs) With Subthreshold Swing (SS) Less THan 60 mV/dec"; IEEE Electron Device Letters, IEEE Service Center, New York, NY, US vol. 28, No. 8, Aug. 1, 2007, pp. 743-745.

(Continued)

*Primary Examiner* — David Nhu
(74) *Attorney, Agent, or Firm* — Cantor Colburn LLP; Vazken Alexanian

(57) ABSTRACT

A semiconductor fabrication method includes depositing a dummy gate layer onto a substrate, patterning the dummy gate layer, depositing a hardmask layer over the dummy gate layer, patterning the hardmask layer, etching a recess into the substrate, adjacent the dummy gate layer, depositing a semiconductor material into the recess, removing the hardmask layer, depositing replacement spacers onto the dummy gate layer, performing an oxide deposition over the dummy gate layer and replacement spacers, removing the dummy gate and replacement spacers, thereby forming a gate recess in the oxide and depositing a gate stack into the recess.

20 Claims, 13 Drawing Sheets

(56) References Cited

U.S. PATENT DOCUMENTS

| | | |
|---|---|---|
| 6,838,326 B2 | 1/2005 | Kwon |
| 7,074,662 B2 | 7/2006 | Lee et al. |
| 7,198,990 B2 | 4/2007 | Joshi et al. |
| 7,242,056 B2 | 7/2007 | Chaudhry et al. |
| 7,453,113 B2 | 11/2008 | Ouyang et al. |
| 7,465,976 B2 | 12/2008 | Kavalieros et al. |
| 8,178,400 B2 * | 5/2012 | Chang et al. .................. 438/197 |
| 2006/0258072 A1 | 11/2006 | Kavalieros et al. |
| 2007/0178650 A1 | 8/2007 | Chen et al. |
| 2009/0026491 A1 | 1/2009 | Booth, Jr. et al. |

OTHER PUBLICATIONS

International Search Report & Written Opinion; International Application No. PCT/EP2011/055689; International Filing Date: Apr. 12, 2011; Date of Mailing: Jun. 21, 2011; 10 pages.

* cited by examiner

REPLACEMENT SPACER FOR TUNNEL FETS

CROSS-REFERENCE TO RELATED APPLICATIONS

This application is a divisional of U.S. patent application Ser. No. 12/567,963, filed Sep. 28, 2009, now U.S. Pat. No. 8,178,400, the disclosure of which is incorporated by reference herein in its entirety.

GOVERNMENT LICENSE RIGHTS

This invention was made with Government support under U.S. Government contract FA8650-08-C-7806. The Government has certain rights in this invention.

BACKGROUND

The present invention relates to semiconductor manufacturing, and more specifically, to a method for manufacturing tunnel field effect transistor (FET) structures implementing a replacement spacer.

Power consumption of conventional microprocessors can be lowered by dropping supply voltage $V_{dd}$. Conventional metal oxide semiconductor FETs (MOSFETs) at lower Vdd have degraded $I_{on}$-$I_{off}$ performance. To maintain similar $I_{on}$-$I_{off}$ performance as today's state-of-the-art CMOS at low $V_{dd}$, devices with sub-threshold slope S<60 mV/decade are implemented. For achieving S<60 mV/decade, non-thermionic turn-off mechanisms, such as impact ionization or band-to-band tunneling, are implemented. Impact ionization requires very high voltages and generates hot carriers that lead to poor reliability when used in conjunction with a gate oxide for achieving gate-controlled impact ionization. Gate oxide degradation due to hot-electron effects is avoided in MOSFETs due to reliability concerns. Gate-controlled, source-side band-to-band tunneling can be utilized for achieving S<60 mV/decade. Tunnel FETs can, in principle, be operated at low $V_{dd}$. Furthermore, tunnel FETs are not expected to suffer from any known reliability issues.

Among tunnel FETs using Si/SiGe heterojunctions, known device structures include a p+ SiGe source, p-Si or i-Si body, and n+ Si drain for N-channel FETs, as shown below. The method for forming the structure leads to the gate oxide being exposed to epi preclean that is performed prior to source-side SiGe epitaxy. Epi preclean is done for preparing a clean surface for epitaxy and generally consists of a wet etch that includes HF for removing native oxide. This HF etch leads to local thinning of the exposed gate oxide and can completely remove the exposed gate oxide, thereby leading to gate-to-source shorts.

SUMMARY

Exemplary embodiments include a semiconductor fabrication method, including depositing a dummy gate layer onto a substrate, patterning the dummy gate layer, depositing a hardmask layer over the dummy gate layer, patterning the hardmask layer, etching a recess into the substrate adjacent the dummy gate layer, depositing a semiconductor material into the recess, removing the hardmask layer, depositing replacement spacers onto the dummy gate layer, performing an oxide deposition over the dummy gate layer and replacement spacers, removing the dummy gate and replacement spacers, thereby forming a gate recess in the oxide and depositing a gate stack into the recess.

Additional exemplary embodiments include a semiconductor fabrication method on a substrate having an oxide layer, the method including forming a dummy gate layer on the oxide layer, forming a hardmask layer on a portion of the dummy gate and the oxide layer, forming a semiconductor heterojunction adjacent the hardmask layer, removing the hardmask layer, widening the dummy gate layer to overlap the heterojunction, performing an oxide deposition to increase a depth of the oxide layer around the dummy gate, removing the dummy gate, and forming a gate stack within the oxide layer.

Further exemplary embodiments include a tunnel field effect transistor device, including a substrate, an oxide layer disposed on the substrate, a heterojunction semiconductor material disposed in the substrate and a gate disposed on the oxide layer adjacent and overlapping the heterojunction semiconductor material, wherein the gate is disposed in a recess in additional oxide on a portion of the oxide layer, the recess formed by oxidizing the oxide layer around a dummy gate and replacement spacer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

There is a need for forming tunnel FETs which preserves the gate oxide and prevents gate to source shorts. In exemplary embodiments, the methods described herein describe manufacture of a controlled overlap of the gate over the heterojunction in tunnel FETs. The overlap of the gate over the heterojunction determines the key DC electrical parameters of the FET by way of the electrostatics. These parameters include, but are not limited to: on-current ($I_{on}$), off-current ($I_{off}$), subthreshold slope, and threshold voltage. In addition, the overlap length of the heterojunction sets the parasitic overlap capacitance, which determines the AC performance of the FET. Variations in the gate overlap of the heterojunction leads to variability in both DC and AC performance of the FET. These variations impact both circuit-level performance as well as yield, and it is therefore desirable to control this overlap length. In exemplary embodiments, the methods described herein form tunnel FET structures and implement a replacement gate with replacement spacer that control of the overlap between the gate and the tunnel junction, and avoids exposure of the gate oxide to erosive processing.

Figure 1:
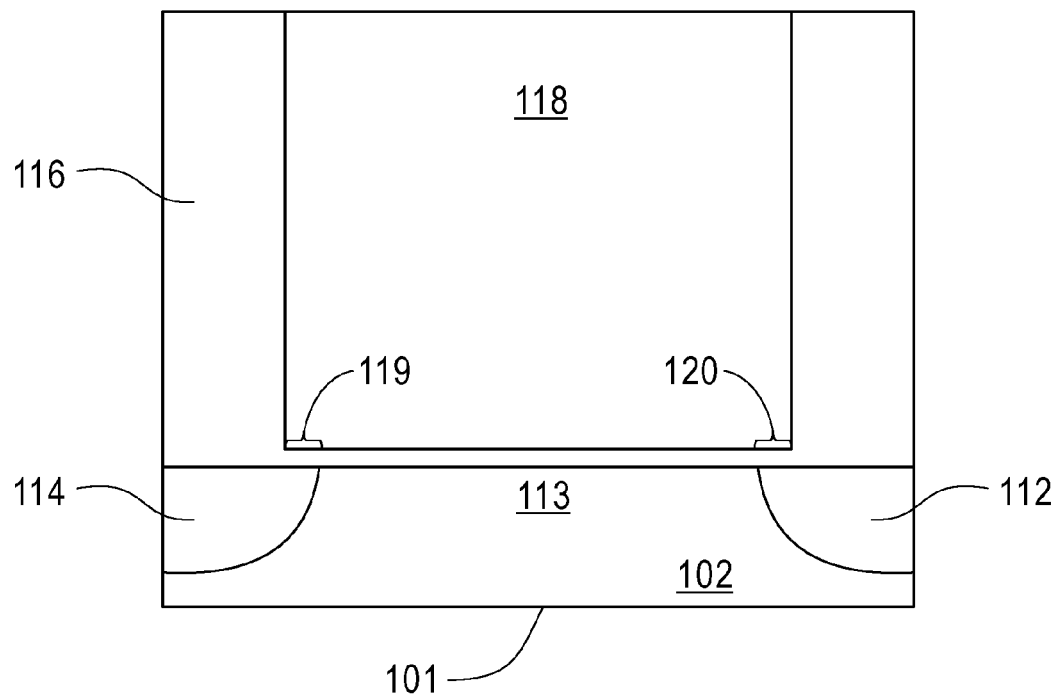
FIG. 1 illustrates a cross-sectional view of an exemplary heterojunction tunnel FET formed in a well of a semiconductor substrate.

FIG. 1 illustrates a cross-sectional view of an exemplary heterojunction tunnel FET 100 formed in a well region 102 of a semiconductor substrate 101. In exemplary embodiments, the methods described herein form the controlled overlap regions 119, 120 over the heterojunctions at the source and drain regions 112, 114. The tunnel FET 100 can be any type of tunnel FET such as a p-channel FET formed in an n-well, in which the drain region 114 is doped with a p-type dopant species and the source region is doped with a n n-type dopant species, the source and drain regions 112, 114 being different semiconductor materials from one another. Those skilled in the art appreciate that the exemplary embodiments described herein can be applied to any type of tunnel FET in which it is desirable to closely control the overlap of the gate over the heterojunction regions. The tunnel FET 100 includes the source region 112, the drain region 114, a channel region 113 located between the source and drain regions 112 and 114. A gate stack, which can include a gate dielectric 116 and a gate conductor 118, is disposed over the channel region 113. As described above, the drain region 114 of the tunnel FET 100 includes a first semiconductor material and is doped a first dopant species. The channel region 113 can also include the first semiconductor material and is doped with the first dopant species. The source region 112 of the tunnel FET 100 can include a second semiconductor material, which is different from that of first semiconductor material. In addition, the source region 112 is doped with a second dopant species.

As further described herein, the exemplary heterojunction tunnel FET 100 can be fabricated by using a conventional CMOS process flow, in additional to the exemplary controlled overlap steps. Therefore, the exemplary heterojunction tunnel FET 100 can be readily integrated side-by-side with MOSFET(s) to form improved CMOS circuits.

Figure 2:
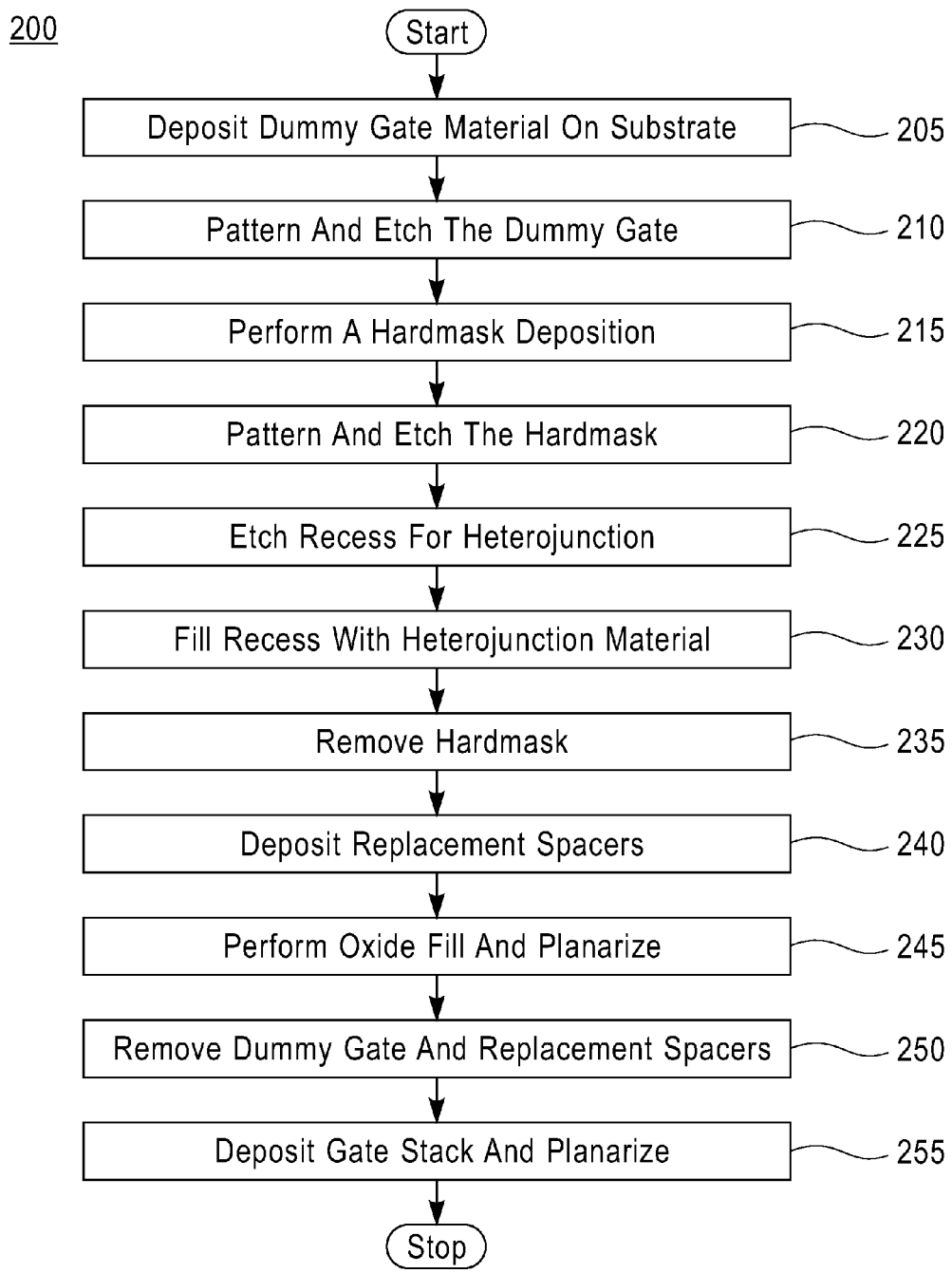
FIG. 2 illustrates a flowchart of a method for fabricating a FET having a controlled gate overlap length over the heterojunction in accordance with exemplary embodiments.

FIG. 2 illustrates a flowchart of a method 200 for fabricating a FET having a controlled gate overlap length over the heterojunction in accordance with exemplary embodiments. As described herein, the fabrication method 200 includes fabricating a replacement gate spacer during the fabrication process as now described. In exemplary embodiments, those skilled in the art will appreciate that the exemplary FETs described herein can be fabricated with standard tunnel FET processing including an exemplary dummy gate. FIGS. 3-13 illustrate resulting structures during each of the fabrication steps.

Figure 3:
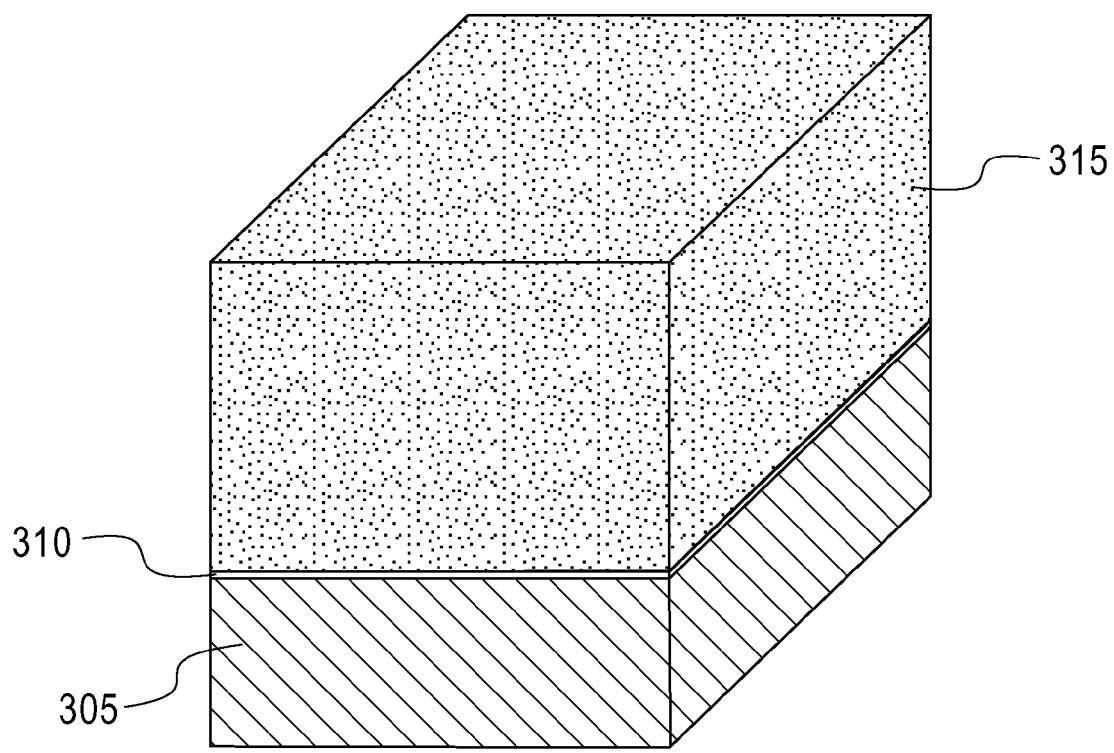
FIG. 3 illustrates a starting structure for an exemplary FET manufactured in accordance with exemplary embodiments.

FIG. 3 illustrates a starting structure 300 including a substrate 305, gate dielectric (e.g., oxide) layer 310 and dummy gate layer 315. In exemplary embodiments, the substrate layer is Si, the oxide layer 310 is $SiO_2$ and the dummy gate layer 315 is a material such as nitride. At block 205, in exemplary embodiments, the method 200 begins with depositing the dummy gate layer 315 over the oxide layer 310. In exemplary embodiments, standard deposition techniques may be implemented to deposit the dummy layer 315, such as but not limited to chemical vapor deposition (CVD), plasma-assisted CVD, physical vapor deposition (PVD), metalorganic chemical vapor deposition (MOCVD), atomic layer deposition (ALD), evaporation, reactive sputtering, chemical solution deposition or any other suitable deposition process. In addition, the oxide layer 310 can be a native oxide layer or can be further deposited by standard techniques such as wet or dry oxide deposition.

Figure 4:
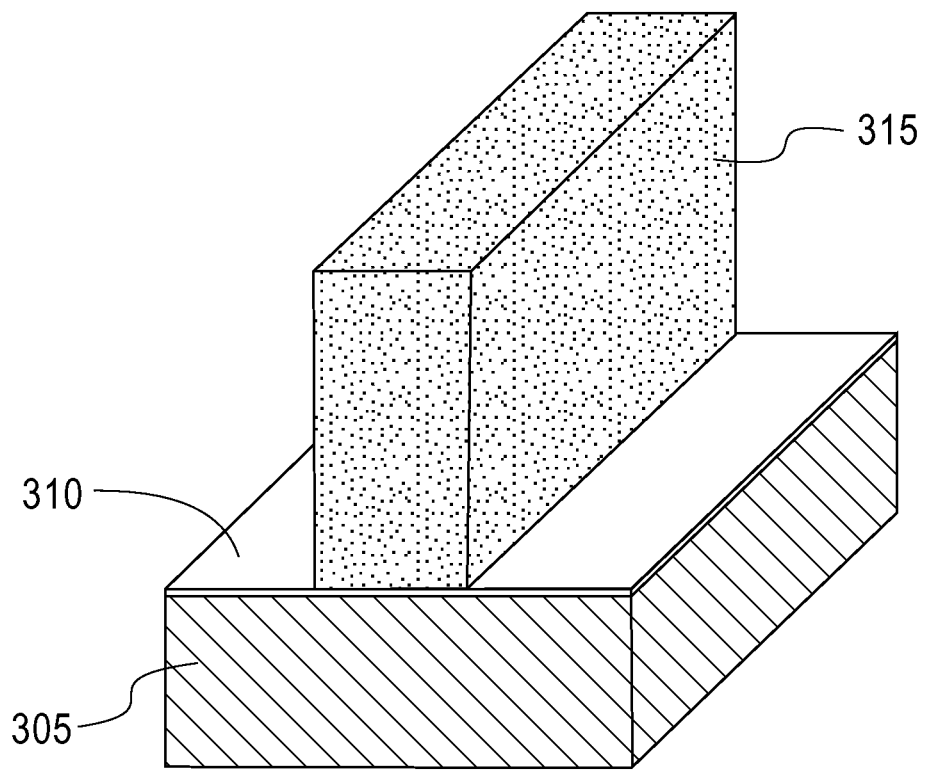
FIG. 4 illustrates an etched dummy gate structure manufactured in accordance with exemplary embodiments.

At block, 210, the fabrication method 200 includes patterning the dummy gate layer 315 and etching the dummy gate layer 315 to a desired length that is adjacent to an eventual heterojunction as described further herein. FIG. 4 illustrates an etched dummy gate structure 400 illustrating the substrate 305, the oxide layer 310 and the etched dummy gate layer 315. In exemplary embodiments, standard masking and photolithography techniques can be implemented to pattern the dummy gate layer 315. In addition, standard etching techniques, such as, reactive ion etching, can be implemented to etch the dummy gate pattern on the oxide layer 310.

Figure 5:
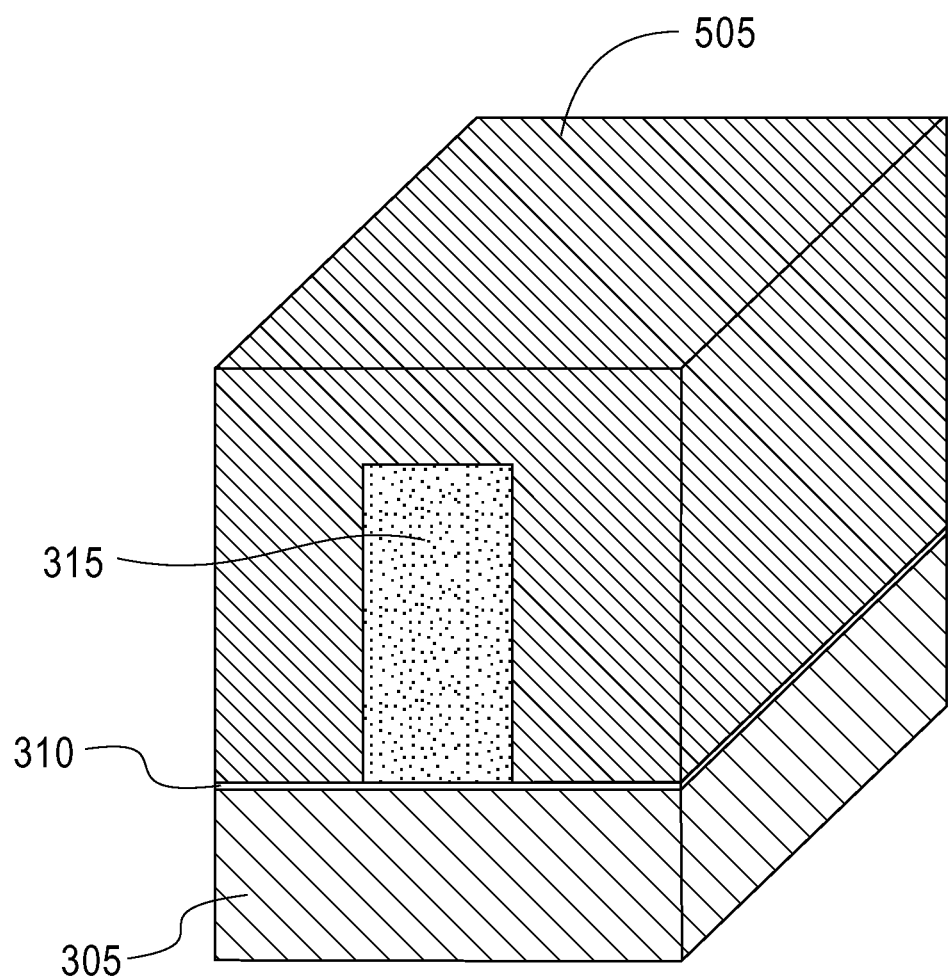
FIG. 5 illustrates a hardmask structure manufactured in accordance with exemplary embodiments.

At block 215, the fabrication method 200 includes depositing a hardmask over the dummy gate 315 and exposed oxide layer 310. In exemplary embodiments, a material such as an oxide can be deposited by standard deposition techniques such as those techniques described herein. FIG. 5 illustrates a hardmask structure 500 illustrating the substrate 305, the oxide layer 310, the etched dummy gate layer 315 and a hardmask layer 505.

Figure 6:
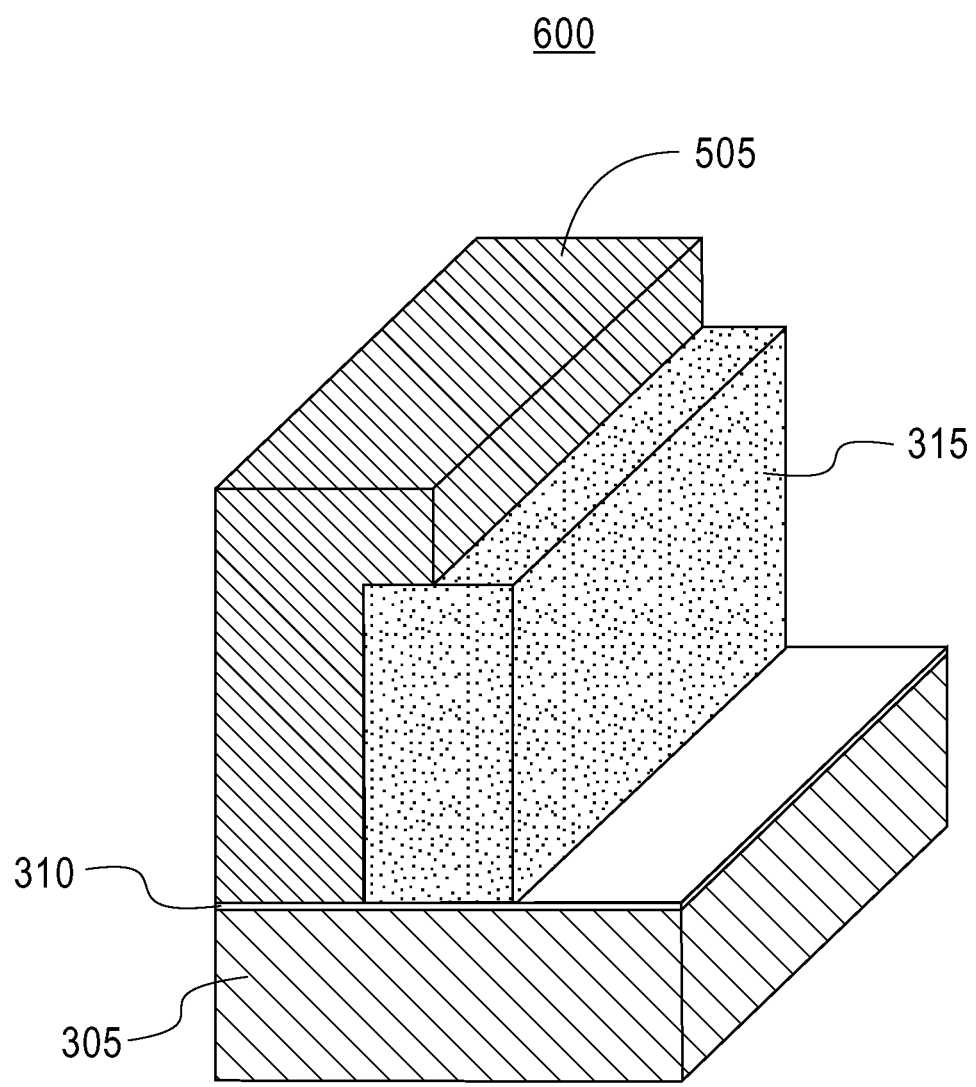
FIG. 6 illustrates an etched hardmask structure manufactured in accordance with exemplary embodiments.

At block 220, the fabrication method further includes performing a hardmask patterning and etching to expose the oxide layer 310 (and substrate 305) into which the heterojunction is to be formed. FIG. 6 illustrates an etched hardmask structure 600 illustrating the substrate 305, the oxide layer 310, the etched dummy gate layer 315, and the etched hardmask layer 505. In exemplary embodiments, standard masking and photolithography techniques can be implemented to pattern the hardmask layer 505. In addition, standard etching techniques can be implemented to etch hardmask pattern on the dummy gate 315 and the oxide layer 310 to prepare for the heterojunction layer formation.

Figure 7:
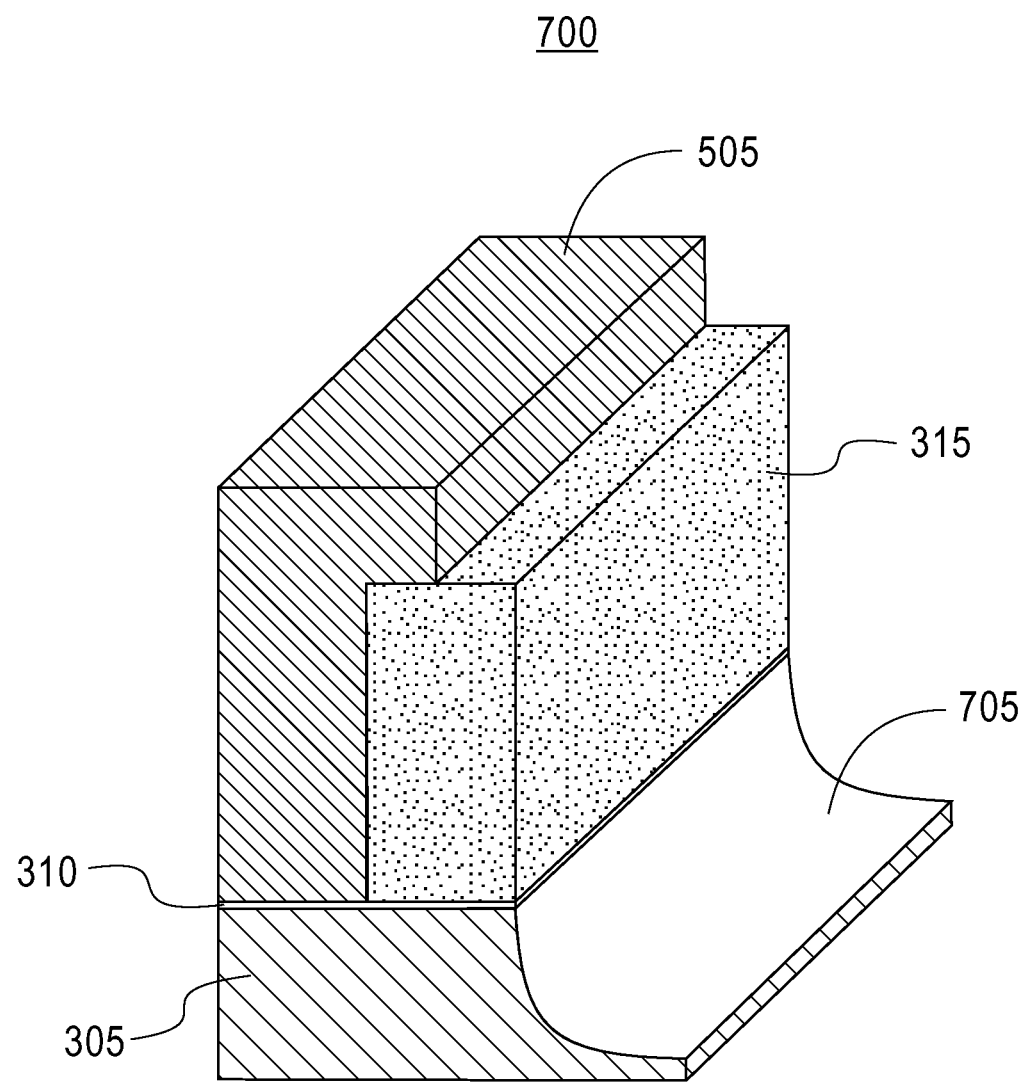
FIG. 7 illustrates an etched heterojunction recess structure manufactured in accordance with exemplary embodiments.

At block 225, the fabrication method 200 further includes performing a heterojunction etch to generate a recess into which material for the heterojunction is deposited. FIG. 7 illustrates an etched heterojunction recess structure 700 illustrating the substrate 305, the oxide layer 310, the etched dummy gate layer 315, the etched hardmask layer 505, and a heterojunction recess 705. In exemplary embodiments, standard masking and photolithography techniques can be implemented to pattern the etch for the heterojunction recess 705. In addition, standard etching techniques can be implemented to etch the heterojunction recess through the oxide layer 310 and into the substrate 305. Those skilled in the art appreciate that the heterojunction recesses can accommodate either a source or a drain. For illustrative purposes, a source recess is shown in FIG. 7.

Figure 8:
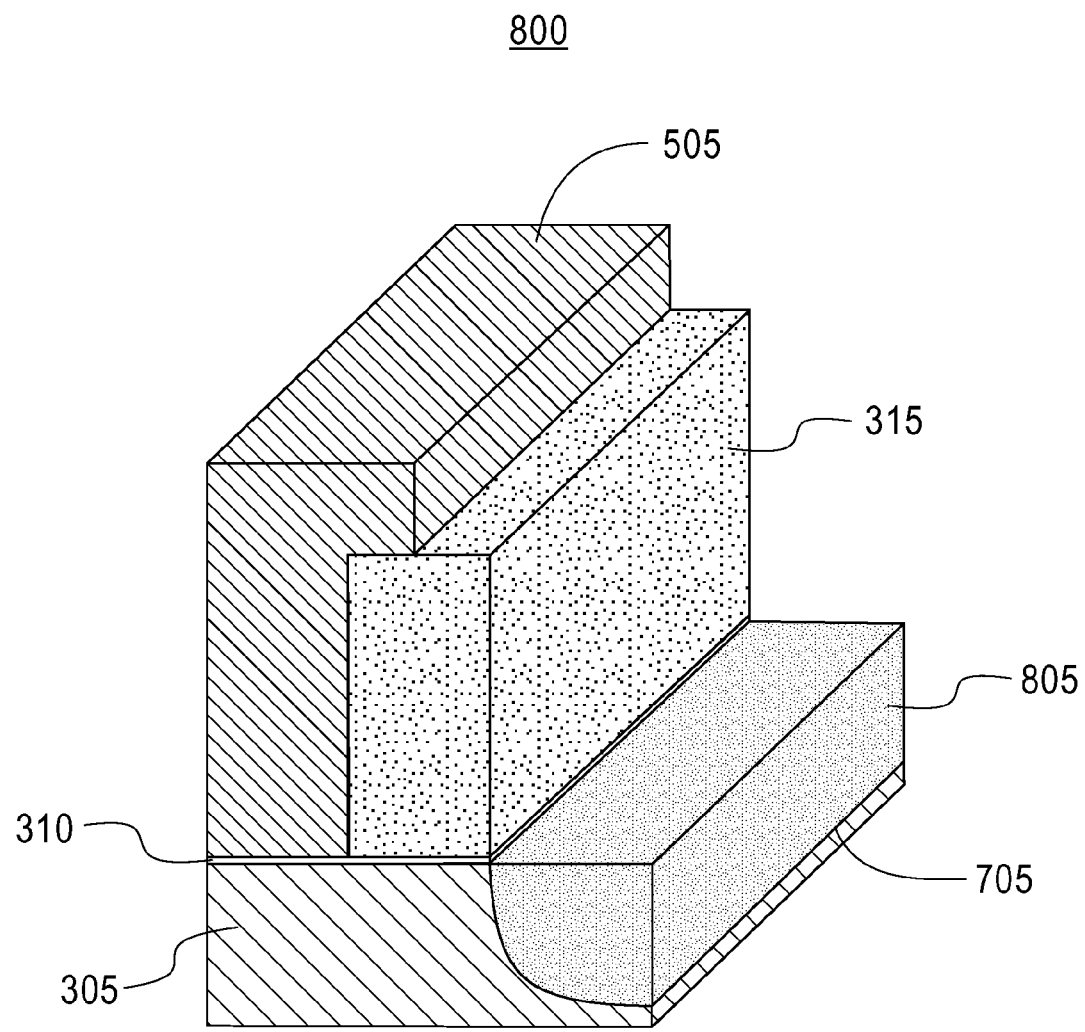
FIG. 8 illustrates an etched heterojunction region structure manufactured in accordance with exemplary embodiments.

At block 230, the fabrication method 200 further includes forming the heterojunction by filling the heterojunction recess 705 with a suitable heterojunction material. FIG. 8 illustrates an etched heterojunction region structure 800 illustrating the substrate 305, the oxide layer 310, the etched dummy gate layer 315, the etched hardmask layer 505, and a heterojunction recess 705, now including a heterojunction region 805. The heterojunction region 805 can be grown in heterojunction recess 705 using epitaxial growth that grows on the substrate 305 but not on any other exposed materials such as the etched dummy gate layer 315 or the etched hardmask layer 505. Furthermore, the heterojunction region 805 can be any suitable semiconductor material, such as but not limited to a group III-V material including Si, Ge, SiGe or SiC. Those skilled in the art can appreciate that other standard CMOS techniques can be performed as well, including but not limited to doping the heterojunction region 805. For example, if the heterojunction region 805 as a source (see the source 112 in FIG. 1 for example) is a p-type source, then the heterojunction region 805 can be doped with a p-type dopant species such as an element from Group IIIA including but not limited to aluminum, boron, gallium, and indium. Furthermore, as an example, if the heterojunction region 805 as a source (see the drain 112 in FIG. 1 for example) is an n-type source, then the heterojunction region 805 can be doped with a n-type dopant species such as an element including but not limited to phosphorous, arsenic and antimony. Regardless of the channel type, dopant species and CMOS processing steps, at block 230, the heterojunction region 805 is formed in the heterojunction recess 705 as described.

Figure 9:
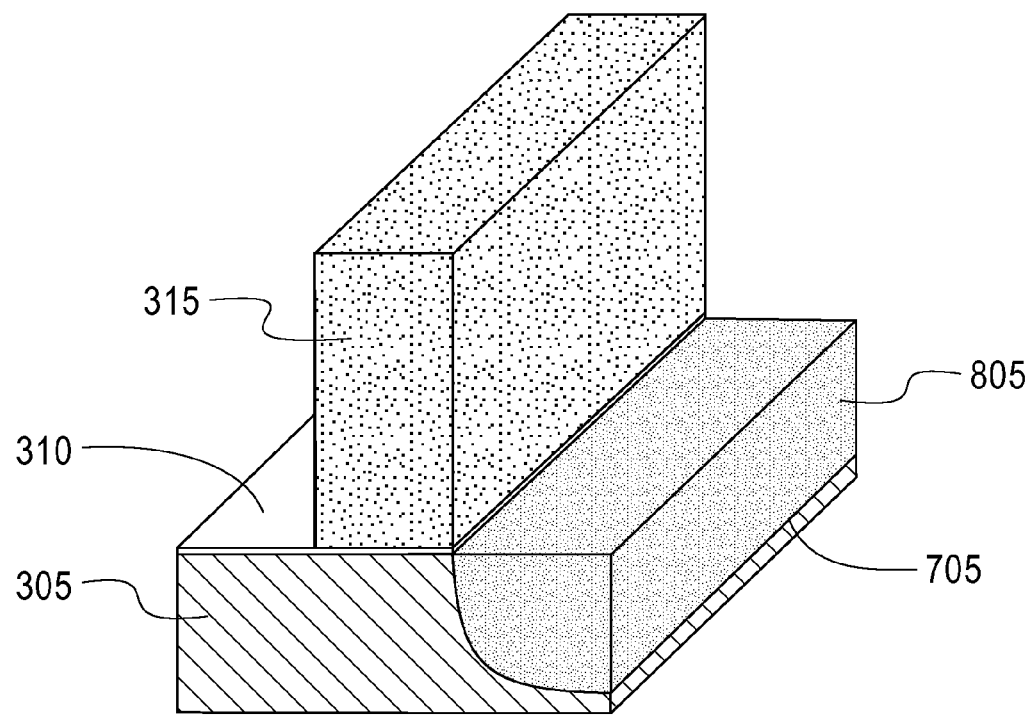
FIG. 9 illustrates an intermediate structure manufactured in accordance with exemplary embodiments.

At block 235, the method 200 further includes removing the hardmask layer 505. FIG. 9 illustrates an intermediate structure 900 illustrating the substrate 305, the oxide layer 310, the etched dummy gate layer 315, a heterojunction recess 705, and heterojunction region 805. In exemplary embodiments, standard etching techniques such as a HF etch can be implemented to etch the hardmask layer 505.

Figure 10:
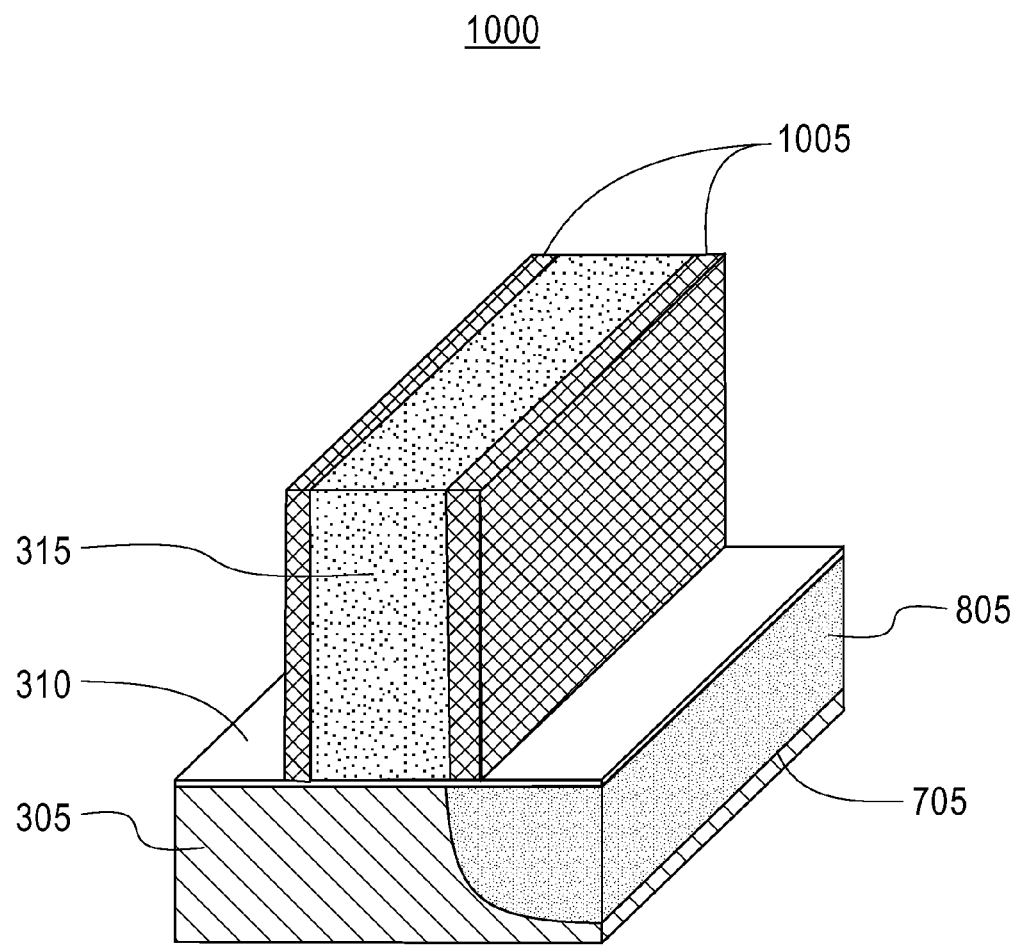
FIG. 10 illustrates a replacement spacer structure manufactured in accordance with exemplary embodiments.

At block 240, the method 200 further includes depositing a replacement spacer on the dummy gate layer 315. FIG. 10 illustrates a replacement spacer structure 1000 illustrating the substrate 305, the oxide layer 310, the etched dummy gate layer 315, a heterojunction recess 705, heterojunction region 805, and replacement spacers 1005. In exemplary embodiments, the replacement spacers 1005 are fabricated for a controlled overlap region between the eventual gate (see the gate 118 and controlled overlap regions 119, 120 in FIG. 1) and the heterojunction region 805. Furthermore, the replacement spacers 1005 are the same material as the dummy gate for both ease of deposition and ease of etching. In exemplary embodiments, the replacement spacers 1005 can be deposited as a conformal layer of nitride, for example, implementing low pressure CVD (LPCVD) or rapid thermal CVD (RTCVD). Furthermore, by performing an anisotropic reactive ion etching (RIE), end-pointed when the substrate 305 and heterojunction 805, results in the replacement spacers 1005 on the sidewalls of the dummy gate layer 315. By depositing the replacement spacers 1005 at this processing step in the CMOS processing, it is appreciated that the length of the overlap of the heterojunction region 805 is controlled precisely, by time and known rate of deposition of the replacement spacer 1005 material. As such, the method 200 enables generation of a distinct distance of overlap over the heterojunction regions. The addition of the replacement spacers 1005 effectively increases the width of the dummy gate layer 315. As further described below, block 240 determines the eventual overlap of the gate.

Figure 11:
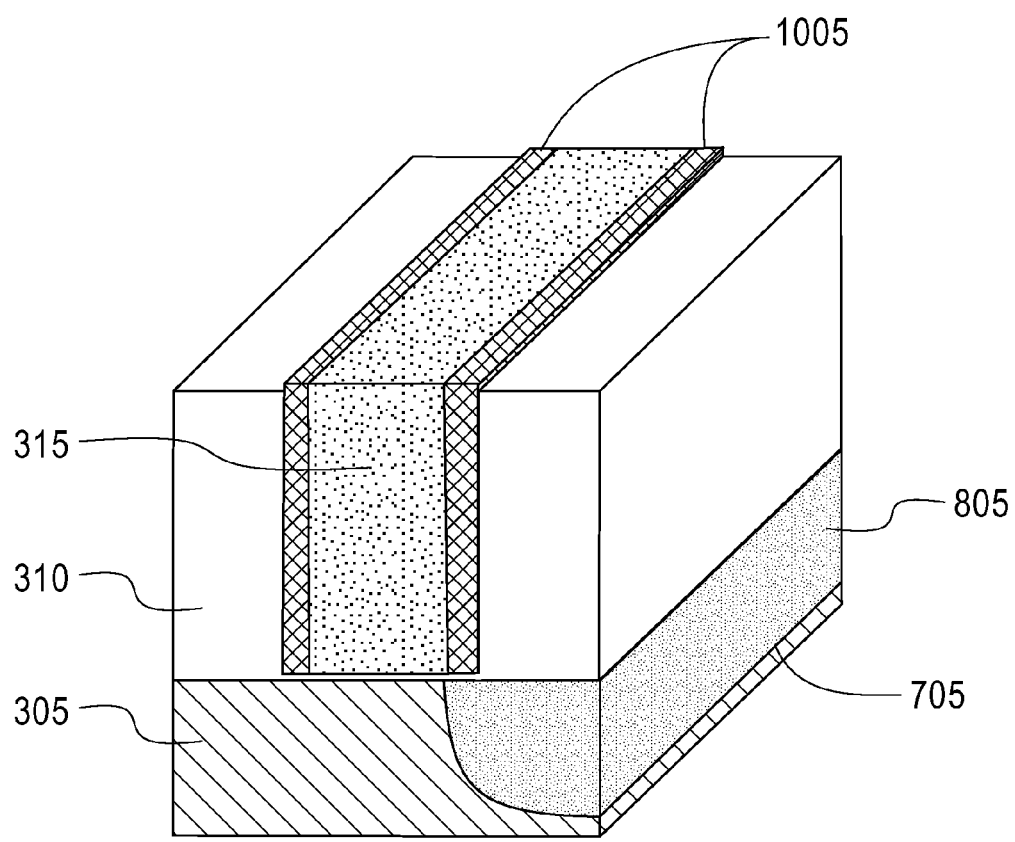
FIG. 11 illustrates a planarized structure manufactured in accordance with exemplary embodiments.

At block 245, the method 200 includes performing an oxide deposition and polishing. FIG. 11 illustrates a planarized structure 1100 illustrating the substrate 305, the oxide layer 310 (which has been increased in depth), the etched dummy gate layer 315, a heterojunction recess 705, heterojunction region 805, and the replacement spacer 1005. In exemplary embodiments, the entire structure 1100 can be created by depositing oxide beyond the dummy gate layer 315. Any suitable oxide deposition technique can be implemented to add to the oxide layer 310, such as plasma-enhanced chemical vapor deposition (PECVD). In exemplary embodiments, the structure 1100 is then polished to the level of the dummy gate layer 315 to expose the dummy gate layer. Any suitable polishing technique can be implemented such as but not limited to chemical mechanical polishing (CMP).

Figure 12:
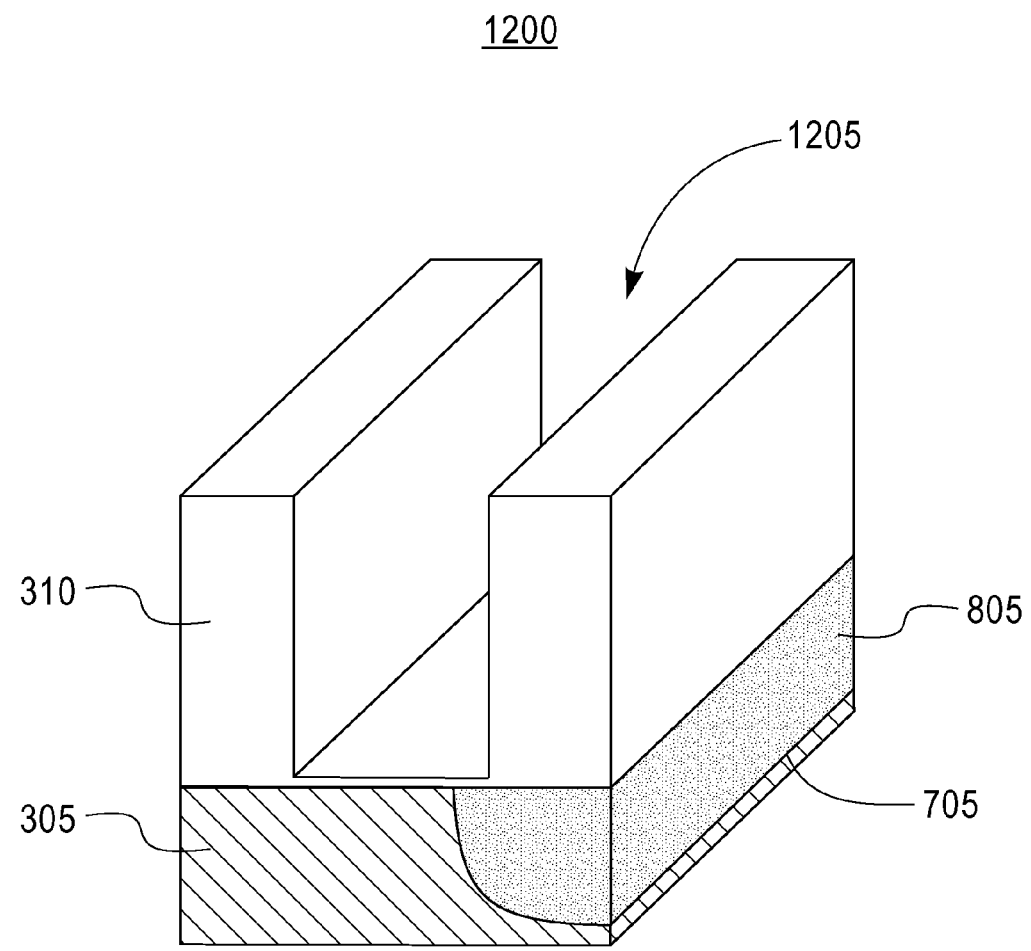
FIG. 12 illustrates an intermediate structure manufactured in accordance with exemplary embodiments.

At block 250, the method 200 further includes removing the dummy gate layer 315. FIG. 12 illustrates an intermediate structure 1200 illustrating the substrate 305, the oxide layer 310, from which the etched dummy gate layer 315 and replacement spacer have been removed, the heterojunction recess 705, and the heterojunction region 805. In exemplary embodiments, standard etching techniques can be implemented to etch removing the dummy gate layer 315 and the replacement spacer 100. For example, an etch implementing hot phosphoric acid can be performed. The intermediate structure 1200 then includes a gate recess 1205.

Figure 13:
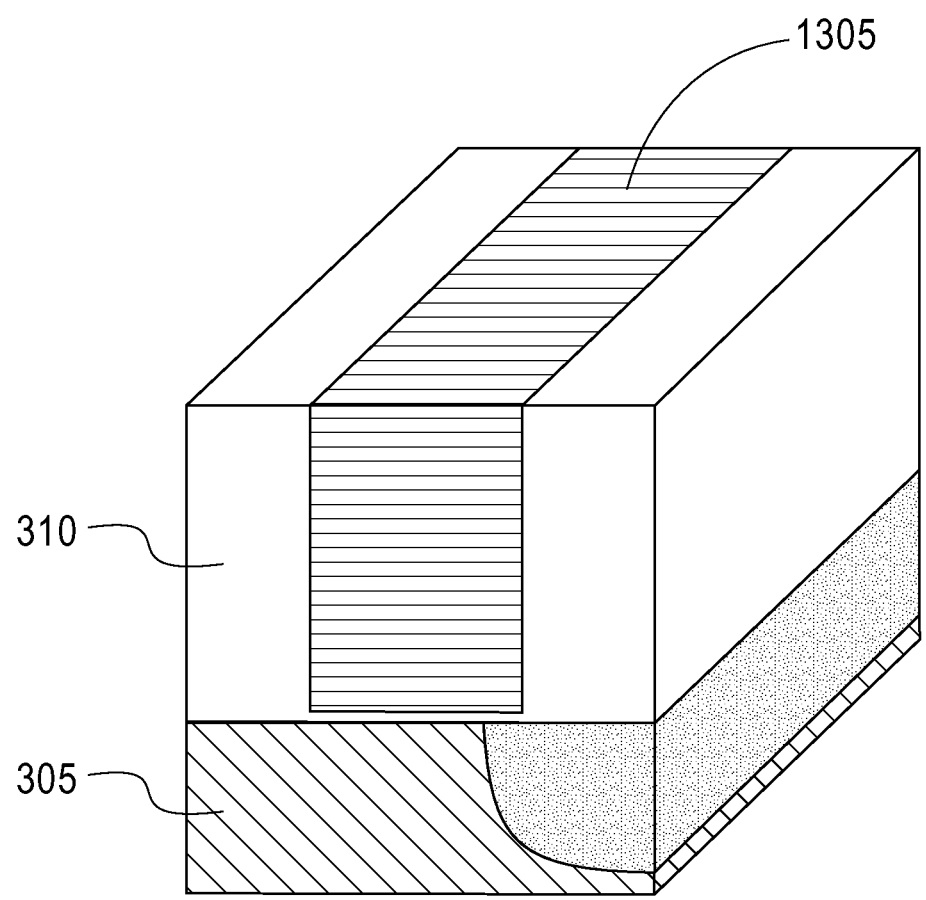
FIG. 13 illustrates a portion of a tunnel FET structure manufactured in accordance with exemplary embodiments.

At block 255, the method 200 further includes depositing a gate stack into the gate recess 1205. FIG. 13 illustrates a portion of a tunnel FET structure 1300 illustrating the substrate 305, the oxide layer 310, a gate stack 1305 disposed in the oxide layer 310, the heterojunction recess 705, and the heterojunction region 805. In exemplary embodiments, the gate stack 1305 can be any suitable material such as but not limited to: a combination of oxide (e.g., $SiO_2$) and polysilicon, or a HiK metal stack such as $HfO_2$+TiN+W. Prior to depositing the gate stack, a hydrofluoric (HF) etch can be performed on the oxide layer 310 to remove any additional oxidation making the resulting oxide layer 310 (i.e., the gate dielectric (see for example the gate dielectric 116 in FIG. 1)) thicker than desired. The gate stack can then be deposited by any suitable deposition technique to a depth, which can be beyond the depth of the oxide layer 310. As such, the method 200 can further include planarizing the gate stack 1305. Any suitable polishing technique can be implemented such as but not limited to CMP.

Any further CMOS fabrication steps can further be performed in addition to the exemplary fabrication steps described herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A tunnel field effect transistor device, comprising:
   a substrate;
   an oxide layer disposed on the substrate;
   a heterojunction semiconductor material disposed in the substrate; and
   a gate disposed on the oxide layer adjacent and overlapping the heterojunction semiconductor material, wherein the gate is disposed in a recess in additional oxide on a portion of the oxide layer, the recess formed by oxidizing the oxide layer around a dummy gate and a replacement spacer.

2. The tunnel field effect transistor device according to claim 1 wherein the dummy gate and replacement spacer are disposed adjacent the dummy gate and on the heterojunction semiconductor material prior to oxidation.

3. The tunnel field effect transistor device according to claim 2 wherein the additional oxide is disposed on the oxide layer and adjacent the replacement spacer.

4. The tunnel field effect transistor device according to claim 3 wherein the dummy gate and replacement spacers are configured to be etched from the additional oxide and the oxide layer leaving the recess for a gate stack deposition.

5. A tunnel field effect transistor device, comprising:
   a substrate having a gate recess configured to receive a gate stack;
   a semiconductor material disposed in the recess;
   a dummy gate layer disposed over the substrate;
   a hardmask layer disposed over the dummy gate layer;
   replacement spacers disposed the dummy gate layer; and
   a first oxide layer disposed over the dummy gate layer and replacement spacers,
   wherein removing the dummy gate and the replacement spacers are configured to be removed, thereby forming the gate recess in the first oxide.

6. The tunnel field effect transistor device according to claim 5 further comprising a second oxide layer is disposed between the dummy gate layer and the substrate.

7. The tunnel field effect transistor device according to claim 6 wherein patterning the dummy gate layer is patterned by etching the dummy gate layer to the second oxide layer.

8. The tunnel field effect transistor device according to claim 7 wherein the dummy gate is nitride.

9. The tunnel field effect transistor device according to claim 8 wherein patterning the hardmask is patterned by etching a portion the hardmask layer to the second oxide layer.

10. The tunnel field effect transistor device according to claim 9 wherein the portion of the second oxide layer is etched with the hardmask layer.

11. The tunnel field effect transistor device according to claim 5 wherein the replacement spacers widen the dummy gate, thereby overlapping the semiconductor material in the recess.

12. The tunnel field effect transistor device according to claim 5 wherein the first oxide layer is planarized over the dummy gate and replacement spacers.

13. The tunnel field effect transistor device according to claim 5 wherein the gate stack is planarized.

14. The tunnel field effect transistor device according to claim 5 wherein the first oxide layer is partially etched prior to depositing the gate stack.

15. The tunnel field effect transistor device according to claim 5 wherein the dummy gate and the replacement spacers are etched with phosphoric acid.

16. The tunnel field effect transistor device according to claim 5 wherein the semiconductor material is disposed into the recess by forming the semiconductor material via at least one of molecular beam epitaxy and chemical vapor deposition.

17. A tunnel field effect transistor device, comprising:
   a substrate
   a first oxide layer disposed on the substrate;
   a dummy gate layer disposed on the first oxide layer;
   a hardmask layer disposed on a portion of the dummy gate and the first oxide layer, and configured to be removed; and
   a semiconductor heterojunction adjacent the hardmask layer,
   wherein the dummy gate is configured to overlap the semiconductor heterojunction.

18. The tunnel field effect transistor device according to claim 17 further comprising a second oxide layer disposed over the first oxide layer.

19. The tunnel field effect transistor device according to claim 17 wherein the dummy gate layer is nitride.

20. The tunnel field effect transistor device according to claim 19 wherein the heterojunction semiconductor material is SiGe.

* * * * *